United States Patent

Lycke et al.

[11] Patent Number: 6,034,318
[45] Date of Patent: Mar. 7, 2000

[54] THERMOELECTRIC GENERATOR UNIT

[75] Inventors: Hans Lycke, Bromma; Lennart Holmgren, Järfälla, both of Sweden

[73] Assignee: Volvo Aero Corporation, Sweden

[21] Appl. No.: 09/142,150

[22] PCT Filed: Feb. 21, 1997

[86] PCT No.: PCT/SE97/00296

§ 371 Date: Sep. 2, 1998

§ 102(e) Date: Sep. 2, 1998

[87] PCT Pub. No.: WO98/37587

PCT Pub. Date: Aug. 27, 1998

[51] Int. Cl.[7] .................................................. H01L 35/30
[52] U.S. Cl. ......................... 136/205; 136/204; 136/211; 136/212; 136/230
[58] Field of Search ................................ 136/203, 204, 136/205, 211, 212, 201, 226, 230

[56] References Cited

U.S. PATENT DOCUMENTS

| | | | |
|---|---|---|---|
| 3,197,342 | 7/1965 | Neild, Jr. .................................. | 136/4 |
| 3,481,794 | 12/1969 | Kasschau ................................ | 136/208 |
| 4,510,215 | 4/1985 | Adam ..................................... | 429/99 |
| 4,855,810 | 8/1989 | Gelb et al. ............................... | 357/87 |
| 5,015,546 | 5/1991 | Dulaney et al. ......................... | 429/99 |
| 5,228,923 | 7/1993 | Hed ........................................ | 136/208 |
| 5,437,938 | 8/1995 | Mitsui et al. ............................ | 429/1 |
| 5,441,576 | 8/1995 | Bierschenk et al. .................... | 136/203 |
| 5,817,188 | 10/1998 | Yahatz et al. ........................... | 136/237 |

FOREIGN PATENT DOCUMENTS

| | | |
|---|---|---|
| 0084338 | 1/1983 | European Pat. Off. . |
| 0559573 | 3/1993 | European Pat. Off. . |
| 90/16088 | 12/1990 | WIPO . |

*Primary Examiner*—Kathyrn Gorgos
*Assistant Examiner*—Thomas Parsons
*Attorney, Agent, or Firm*—Ostrolenk, Faber, Gerb & Soffen, LLP

[57] ABSTRACT

The invention refers to a thermoelectric generator unit comprising a plurality of thermoelectric elements (1) of alternately p and n character and electrically series connected by means of metal connector members (2), the elements having essentially cylindrical shape. For securing a drastically improved reliability in the interfaces between the connector members and the respective thermoelectric elements the invention now suggests that said connector members are formed as plates (2), on one side of which are made two substantially semi-cylindrical and parallel seats (3) for thermoelectric elements (1), which connector members are adapted to be placed with said seats (3) facing each other to either side of a row of elements (1) with opposed plates mutually offset one seat width longitudinally of the row so as to form a continuous winding serial path for the generated current, the plates (2) on one side of the element row being adapted to face a heat source while the plates on the opposite side are facing a heat sink.

10 Claims, 3 Drawing Sheets

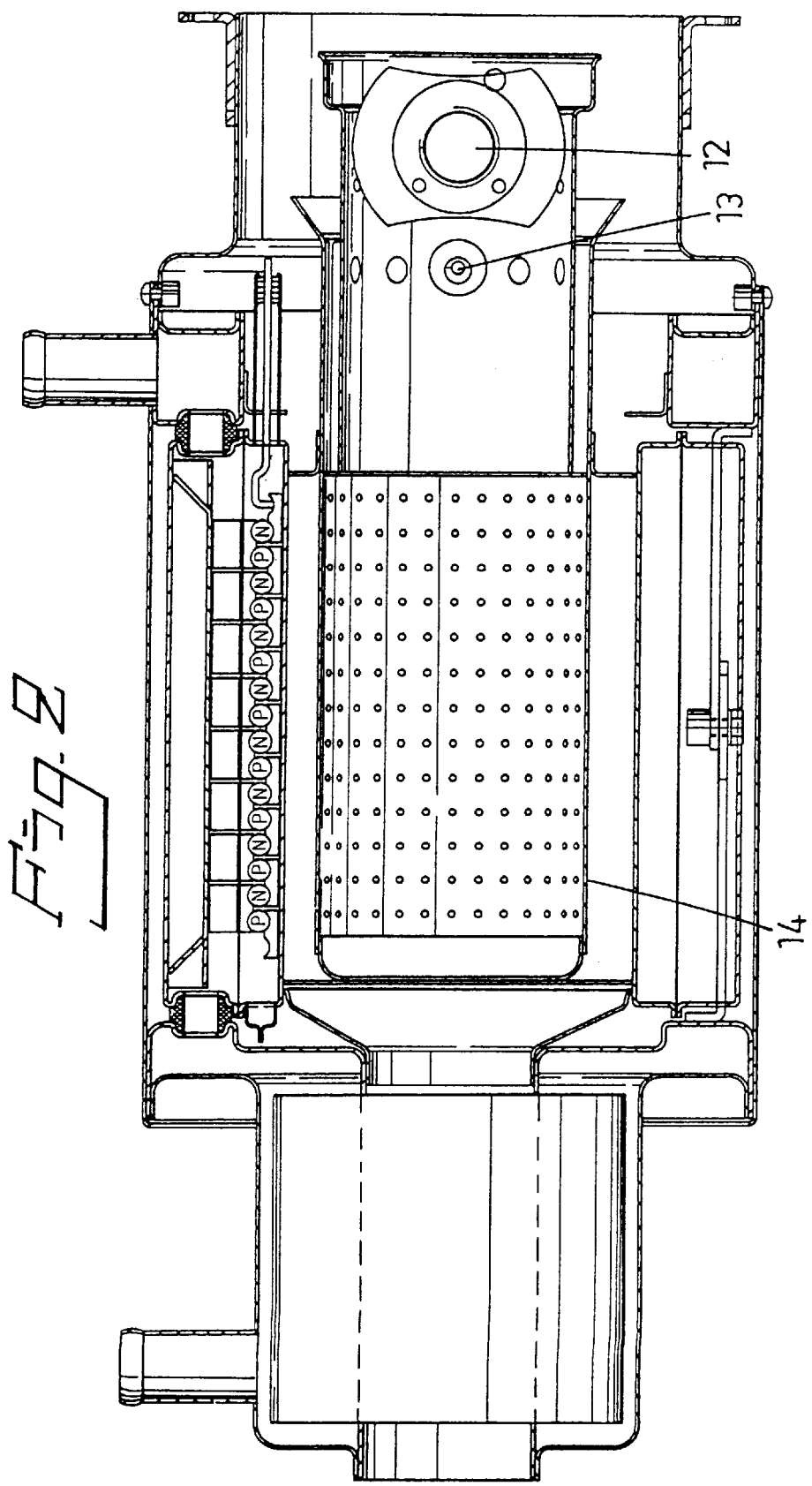

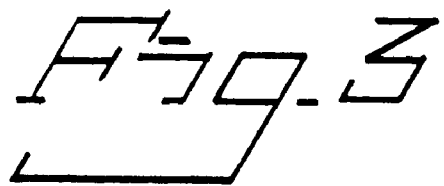
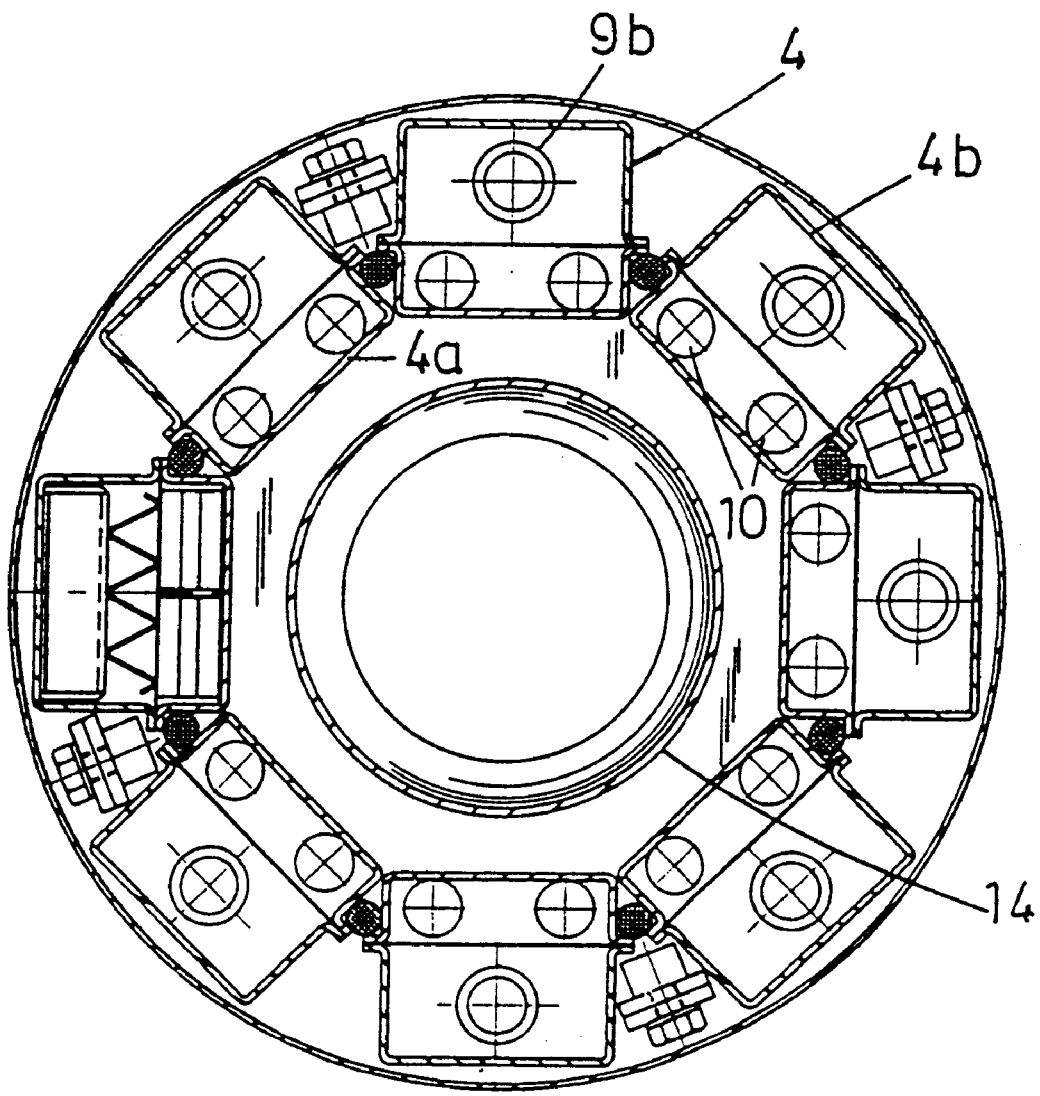

THERMOELECTRIC GENERATOR UNIT

The present invention refers to a thermoelectric generator unit comprising a plurality of thermoelectric elements of alternately p and n character and electrically series connected by means of metal connector members, the elements having essentially cylindrical shape.

Thermoelectric elements are known since long and various attempts-have been made to provide by means of such elements an electric current in connection with heat generation in combustion devices of various kinds. One of the most recent examples is the U.S. Pat. No. A 5,450,869 to the Brittain et al. Since it is in the interface area between elements of p and n character that the current is generated dependent on the temperature difference between the two sides of the elements, it is aimed at providing a great number of very small elements which are to be kept electrically connected with each other in a reliable manner. Previously, this has implied dealing with a very large number of small details which makes it very time-consuming to put together such thermoelectric generators. The invention, according to the above-mentioned publication, had for its primary object to allow a substantial reduction of the number of parts involved in the thermoelectric generator without risk for excessive interface resistances between the elements or interruptions.

However, the suggestion according to said US patent specification was not either suitable for modern industrial mass production.

In order to provide for a mass production of such thermoelectric generators in a way quite different from previous ideas it is now suggested according to the present invention to form the connector members as plates, on one side of which are made two substantially semi-cylindrical and parallel seats for thermoelectric elements, which connector members are adapted to be placed with said seats facing each other to either side of a row of elements with opposed plates mutually offset one seat width longitudinally of the row so as to form a continuous winding serial path for the generated current, the plates on one side of the element row being adapted to face a heat source while the plates on the opposite side are facing a heat sink.

The invention now allows in a much more advantageous way than previously a manufacture of thermoelectric generators compiled of generator units of cassette type which easily can be adapted to various uses, not only in connection with combustion chambers in parking heaters for vehicles but also in almost all occasions in which a hot surface is available on which the inventive generator unit can be located.

BRIEF DESCRIPTION OF THE DRAWINGS

The invention will be further described below with reference to the accompanying drawing in which:

FIG. 2 is a longitudinal section through a parking heater in which a plurality of cassette-like generator units are used and;

FIG. 3 is a cross section of the same heater.

Figure 1:
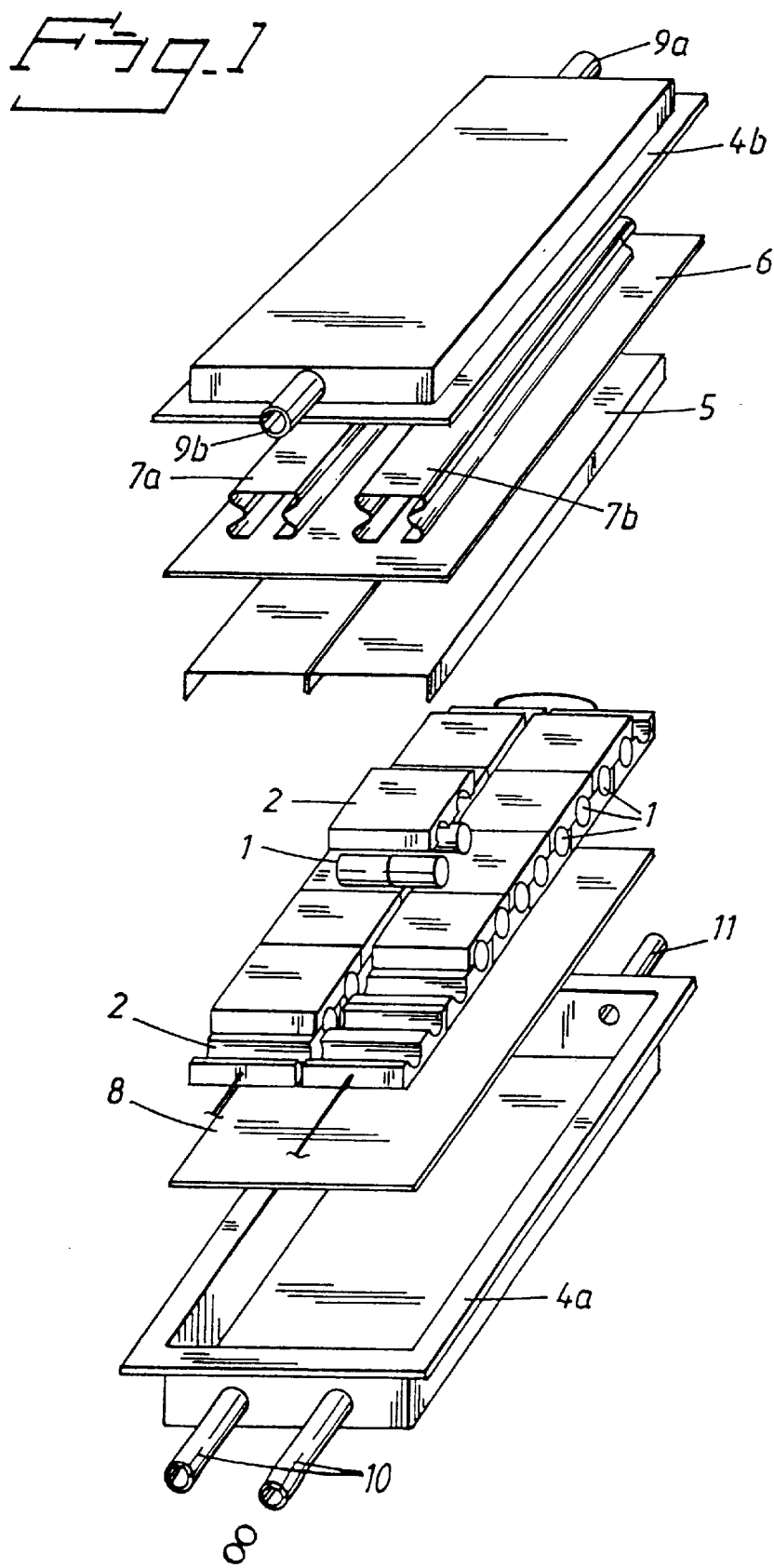
FIG. 1 illustrates the basic cassette-like construction of a unit according to the invention in an exploded perspective view.

As is evident from FIG. 1 a plurality of thermoelectric elements 1 of alternately p and n character are arranged in rows and electrically connected in series by means of connector members 2. In a similar way as in the structure according to the above-stated US patent specification the thermoelectric elements 1 which are made of e.g. lead and tellurium and a doping agent have a cylindrical shape and a length approximately corresponding to their diameter. Dependent on the intended use and the temperature interval other materials with known thermoelectric character may be chosen. Unlike said prior design said cylindrical elements 1 are not to be mounted standing between connector members but according to the present invention the latter have the shape of a plate on one side of which are made two essentially half-cylindrical parallel seats 3 for thermoelectric elements 1. Said plates 2 are intended to be mounted with said seats 3 facing each other on either side of a row of elements 1, opposed plates 2 being mutually off-set one seat width so as to form a continuous winding serial path for the generated current. Preferably, the plates 2 are made planar on their side opposite to the seats 3 or otherwise adapted for lying against an intended hot surface. The opposed plates 2 are facing or engaging a suitable cooled surface.

It is suitable that the plates 2 on either side of the row of thermoelectric elements 1 are made similar to each other.

As is further evident from FIG. 1, it is suggested according to the invention that two such rows of elements 1 with associated connector plates 2 are located in parallel and electrically connected to each other at one end of said pair of rows such that the two connection conduits to the thermoelectric generator unit will be situated adjacent each other at the opposite end of said pair of rows.

For providing a cassette-like design of the unit it is suitable that said pair of element rows is arranged in one trough-like half-part 4a of a surrounding and sealingly closable housing 4. This half-part 4a is intended to face or engage with its bottom surface a hot surface such as a combustion tube of a parking heater while the other half-part 4b of the housing is made as a chamber for a suitable cooling fluid such as water.

It is preferred that the housing 4 is made of stainless steel and in such case it is suitable that the same be welded all around the periferal edge between the half-parts 4a, 4b. Between the rows of thermoelectric elements 1 and the lower half-part of the housing is located an isolating layer 8 of mica or a ceramic material. Between the rows of elements 1 with the associated connector plates 2 and the upper half-part 4b are arranged in order an electrically isolating layer 5 of plastic such as polyimide, a membrane metal plate 6 preferably of stainless steel and a pressure spring device 7 which here consists of two parallel pressure spring profiles 7a, 7b which are urged against the other half-part 4b of the housing. Said other or second half-part 4b of the housing preferably is made, such as is evident from FIG. 1, as a hollow chamber for a suitable cooling fluid such as water. In this figure, it has also been illustrated suitable connecting pieces 9a, 9b for a cooling fluid circuitry.

From FIG. 1, it is also evident that the electric connecting cables for the cassette-like thermoelectric generator unit suitably are arranged to extend from tubular pieces 10 on one end surface of the lower half-part 4a of the housing together with suitable sealing rings. At the opposite small-end of said lower half-part 4a of the housing there are preferably mounted two further tubular pieces 11 adapted to provide for a filling of the trough-shaped space within said half-part 4a with a suitable isolating material such as perlite. Furthermore, said cavity is to be filled finally with some inert gas, preferably of low-heat conduction capacity or be subjected to a vacuum in order to prevent an oxidation of the surfaces between the thermoelectric elements 1 and the connector plates 2, should the thermoelectric material be sensible to oxygene.

In this connection, it is to be stated that said connector plates 2 preferably are made of copper and coated with nickel and as far as the plates at the cooled side are concerned, also with tin, if desired.

A particular advantage of the above-stated construction with so-to-speak "lying" cylindrical elements 1 is that the expansion movements which occur when heating them to the operating temperature of the unit will imply that the pressure force on the respective elements is increased and hence also the good engagement between the elements and the plates. The design according to the invention also provides for manufacturing advantages by allowing an easy maintaining of exact measures of the dimensions of both the element diameter and the connector plates. Furthermore, it is easy to adapt the interface areas to the desired electric effect, burner size etc.

In FIGS. 2 and 3 has been illustrated an example of the use of cassette-like thermoelectric generator units according to the invention in a vehicle parking heater. Said heater thus comprises in its portion to the right of the drawing a fuel supply device 12 of a kind known per se with an ignition device 13 and a combustion tube 14 in which the combustion essentially takes place. The combustion gases then are discharged to the left of said drawing figure. Around the combustion tube 14 are, in this case, arranged eight cassette-like generator units 4 according to the invention. The units are electrically connected as desired and as known per se while the respective second casing halves 4b with their connection pieces are connected to some suitable system for supply of coolant, particularly water.

We claim:

1. A thermoelectric generator unit comprising a plurality of thermoelectric elements (1) of alternately p and n character and electrically connected in series by means of metal connector members (2), the elements having essentially cylindrical shape, characterized in that said connector members are formed as plates (2), on one side of which are made two substantially semi-cylindrical, concave and parallel seats (3) for thermoelectric elements (1), which connector members are adapted to be placed with said seats (3) facing each other to either side of a row of elements (1) with opposed plates mutually offset one seat width longitudinally of the row so as to form a continuous winding serial path for the generated current, the plates (2) on one side of the element row being adapted to face a heat source while the plates on the opposite side are facing a heat sink.

2. A unit according to claim 1, characterized in that for securing a full and reliable electric contact at the interface between the connector plates (2) and the elements (1) at least the surfaces of the seats (3) on the plates (2) of copper are coated with nickel and, as to the plates at the cooled side, also covered with tin, if desired.

3. A unit according to claim 2, characterized in that the thermoelectric elements with associated connector plates a re arranged in two parallel rows which are mutually electric connected while the electric connections are located at an opposite end, said element rows being located in a trough-like half of a surrounding, sealingly closable housing, said half being adapted to engage a hot surface while the other half of the housing consists of a coolant chamber.

4. A unit according to claim 3, characterized in that the housing is made of stainless steel and preferably welded along its peripheral edge between the halves.

5. A unit according to claim 4, characterized in that between the element rows with associated connector plates and the other half of the housing are located in order an electrically isolating layer, a membrane metal sheet preferably of stainless steel, and a pressure spring device biased against said other half of the housing.

6. A unit according to claim 3, characterized in that between the element rows with associated connector plates and the other half of the housing are located in order an electrically isolating layer, a membrane metal sheet preferably of stainless steel, and a pressure spring device biased against said other half of the housing.

7. A unit according to claim 1, characterized in that the thermoelectric elements (1) with associated connector plates (2) are arranged in two parallel rows which are mutually electric connected at while the electric connections are located at an opposite end, said element rows being located in a trough-like half (4a) of a surrounding, sealingly closable housing (4), said half being adapted to engage a hot surface while the other half (4b) of the housing consists of a coolant chamber.

8. A unit according to claim 7, characterized in that the housing (4) is made of stainless steel and preferably welded along its periferal edge between the halves (4a, 4b).

9. A unit according to claim 4, characterized in that between the element rows with associated connector plates and the other half of the housing are located in order an electrically isolating layer, a membrane metal sheet preferably of stainless steel, and a pressure spring device biased against said other half of the housing.

10. A unit according to claim 7, characterized in that between the element rows with associated connector plates (2) and the other half (4b) of the housing (4) are located in order an electrically isolating layer (5), a membrane metal sheet (6) preferably of stainless steel, and a pressure spring device (7) biased against said other half (4b) of the housing.

* * * * *